(12) United States Patent
Fukuchi

(10) Patent No.: US 10,477,674 B2
(45) Date of Patent: Nov. 12, 2019

(54) UNIFORMIZATION OF PARASITIC CAPACITANCE AROUND WIRING OF A CIRCUIT SUBSTRATE

(71) Applicant: Toshiba Memory Corporation, Tokyo (JP)

(72) Inventor: Satoru Fukuchi, Chigasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/691,712

(22) Filed: Aug. 30, 2017

(65) Prior Publication Data

US 2018/0146542 A1    May 24, 2018

(30) Foreign Application Priority Data

Nov. 18, 2016   (JP) ................... 2016-224991

(51) Int. Cl.
*H05K 1/02*  (2006.01)
*H05K 1/11*  (2006.01)
*H05K 1/18*  (2006.01)

(52) U.S. Cl.
CPC .......... *H05K 1/0219* (2013.01); *H05K 1/115* (2013.01); *H05K 1/181* (2013.01); *H05K 2201/09281* (2013.01); *H05K 2201/10159* (2013.01)

(58) Field of Classification Search
CPC ............... H05K 1/0219; H05K 1/115; H05K 2201/09281; H05K 1/0218; H05K 1/0216; H01P 3/003; H01P 3/006; H01P 3/08

USPC ................ 361/767; 333/238, 22 R, 246, 34
See application file for complete search history.

(56) References Cited

U.S. PATENT DOCUMENTS

| 6,043,556 | A | * | 3/2000 | Tomie ................. H01L 23/66 257/664 |
| 6,501,352 | B1 | * | 12/2002 | Koriyama ............. H01L 23/66 333/260 |
| 6,807,065 | B2 | | 10/2004 | Sato |
| 8,325,459 | B2 | | 12/2012 | Mutnury et al. |
| 2004/0174228 | A1 | * | 9/2004 | Kanno ................. H01L 23/66 333/34 |
| 2010/0182105 | A1 | * | 7/2010 | Hein ..................... H01P 3/003 333/239 |
| 2012/0274423 | A1 | * | 11/2012 | Kato ................... H01P 1/20363 333/238 |

(Continued)

FOREIGN PATENT DOCUMENTS

JP   2002-252505 A   9/2002
JP   3539331 B2      7/2004

*Primary Examiner* — Steven T Sawyer
(74) *Attorney, Agent, or Firm* — Kim & Stewart LLP

(57) ABSTRACT

A circuit substrate includes an insulating body, a wiring enclosed by the insulating body, a conductive layer formed within the insulating body on a same plane as the wiring, and electrically insulated from the wiring by the insulating body, and one or more conductive vias extending through an edge portion of the conductive layer in a thickness direction intersecting the plane. A first width of the insulating body between the wiring and the conductive layer at a first position in the plane direction that does not correspond to any of said one or more conductive vias is smaller than a second width of the insulating body between the wiring and the conductive layer at a second position in the plane direction that corresponds to one of said one or more conductive vias.

13 Claims, 7 Drawing Sheets

(56) References Cited

U.S. PATENT DOCUMENTS

2013/0214397 A1 8/2013 Kawai
2015/0325560 A1* 11/2015 Fai ..................... H01L 23/5384
   257/774
2017/0093005 A1* 3/2017 Ou ......................... H01P 3/003

* cited by examiner

UNIFORMIZATION OF PARASITIC CAPACITANCE AROUND WIRING OF A CIRCUIT SUBSTRATE

CROSS-REFERENCE TO RELATED APPLICATION

This application is based upon and claims the benefit of priority from Japanese Patent Application No. 2016-224991, filed Nov. 18, 2016, the entire contents of which are incorporated herein by reference.

FIELD

Embodiments described herein relate generally to a circuit substrate and an electronic device having the same.

BACKGROUND

A circuit substrate in which a conductor is arranged around a wiring via an insulating layer is known. With respect to such a circuit substrate, a structure capable of suppressing deterioration of signal quality is desired.

DETAILED DESCRIPTION

In general, according to an embodiment, a circuit substrate includes an insulating body, a wiring enclosed by the insulating body, a conductive layer formed within the insulating body on a same plane as the wiring, and electrically insulated from the wiring by the insulating body, and one or more conductive vias extending through an edge portion of the conductive layer in a thickness direction intersecting the plane. A first width of the insulating body between the wiring and the conductive layer at a first position in the plane direction that does not correspond to any of said one or more conductive vias is smaller than a second width of the insulating body between the wiring and the conductive layer at a second position in the plane direction that corresponds to one of said one or more conductive vias.

Embodiments and variations of a circuit substrate and an electronic device will be described hereinafter. Structures and technical features of the following embodiments, and functions and effects that can be obtained by the structures, are merely examples. The embodiments and the variations exemplified below have the same structural components. Hereinafter, the same structural components are applied with the same symbols, and duplicate descriptions for the same structural components are omitted.

Figure 1:
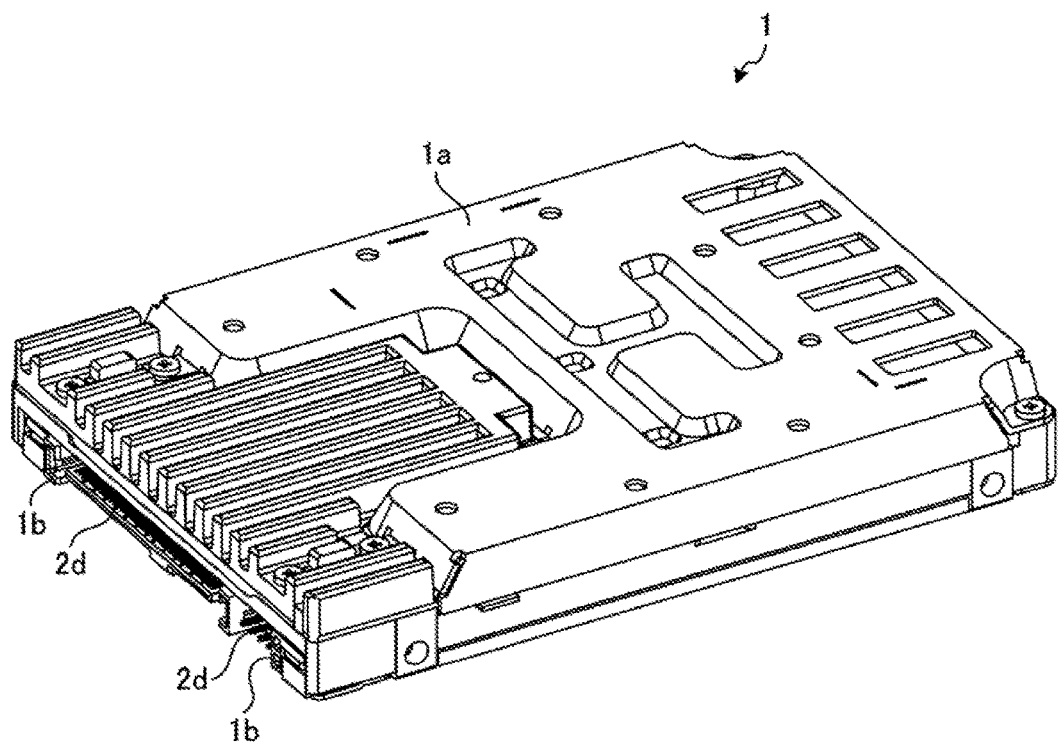
FIG. 1 is a schematic perspective view of an electronic device according to an embodiment.

FIG. 1 is a perspective view of an electronic device 1. The electronic device 1 may be a storage device. As shown in FIG. 1, the electronic device 1 has a case 1a. The case 1a has multiple wall parts, and components are contained in a space surrounded by the wall parts. The case 1a includes an opening 1b at which an interface 2d is exposed. The interface 2d may also be referred to as a connector or a connecting part. The case 1a may be made of a metal material such as an aluminum alloy. The case 1a may be formed of an assembly of multiple members or multiple parts. Specifically, the case 1a may be formed by connecting multiple members with fixing parts such as screws.

Figure 2:
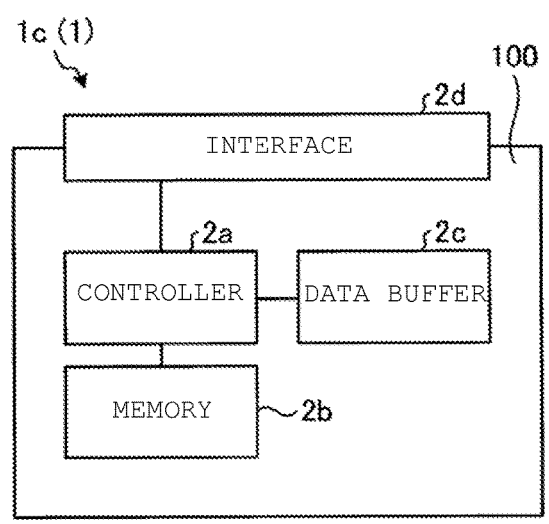
FIG. 2 is a schematic block diagram of a substrate assembly that is included in the electronic device.

FIG. 2 is a block diagram of a substrate assembly 1c of the electronic device 1. The electronic device 1 has a circuit substrate 100. The circuit substrate 100 has electronic components mounted thereon such as a controller 2a, a memory 2b, a data buffer 2c, and an interface 2d, thereby constituting the substrate assembly 1c. The circuit substrate 100 may have a power supply circuit, other circuits, and the like mounted thereon, which are not shown in FIG. 2. Although one controller 2a, one memory 2b, one data buffer 2c, and one interface 2d are described in FIG. 2, the number of each of the components may be two or more.

The controller 2a controls the electronic device 1. The function of the controller 2a may be performed by a processor, hardware, or the like. The processor executes firmware that is stored in a read only memory (ROM) or the like of the memory 2b or the controller 2a. The controller 2a reads out data from the memory 2b and writes data in the memory 2b in accordance with commands received from a host device. The controller 2a may also be referred to as a controlling unit or an operation processing unit.

The memory 2b is a nonvolatile memory and may be a NAND flash memory. The memory 2b is not limited to the NAND flash memory and may be a resistance random access memory (RERAN), a ferroelectric random access memory (FERAM), a flash memory having a three-dimensional structure, or the like. The memory 2b stores user data that are transmitted from a device external to the electronic device 1 such as a host device or a server, system data that are to be used only in the electronic device 1, and the like. The memory 2b has a memory cell array in which multiple memory cells (not shown) are arranged in a matrix configuration. Each of the memory cells can store binary values or multiple values. The memory 2b has multiple memory chips. The memory 2b may also be referred to as a storage unit.

The data buffer 2c temporarily retains data. The data buffer 2c may be a dynamic static random access memory (DRAM). The data buffer 2c is not limited to the DRAM and may be a static random access memory (SRAM) or the like. The data buffer 2c may be provided independently of the controller 2a or may be mounted in a chip of the controller 2a as an incorporated memory.

The interface 2d has multiple pins as a terminal for transmitting electric signals, electric power, and the like, between the interface 2d and an external device. The pins of the interface 2d include a ground pin. The interface 2d is configured in compliance with, for example, serial ATA (SATA), serial attached SCSI (SAS), PCI Express® (PCIe), or the like.

The circuit substrate 100 may be a multilayered substrate or a build-up substrate. The circuit substrate 100 may also be referred to as a printed wiring substrate. The circuit substrate 100 is a rigid substrate or a flexible printed wiring substrate. The circuit substrate 100 may have a flat plate shape.

First Embodiment

Figure 3:
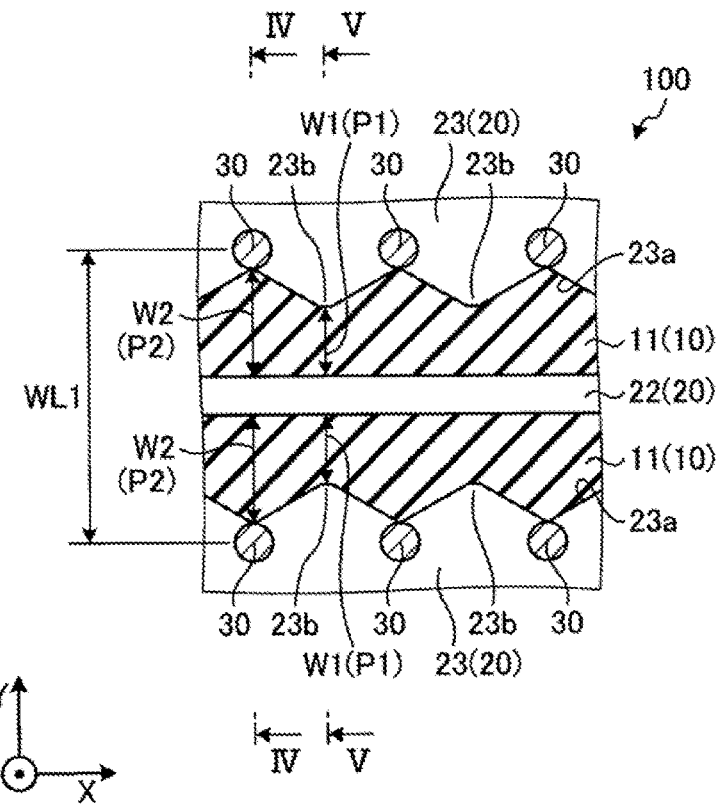
FIG. 3 is a schematic cross-sectional view of a part of a circuit substrate according to a first embodiment, which is taken along a line III-III in FIG. 4.
Figure 4:
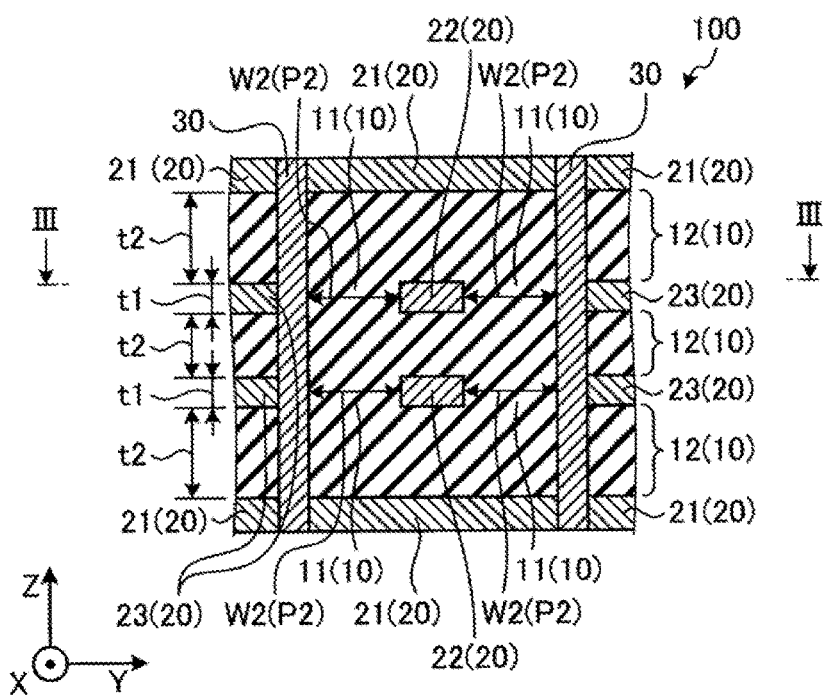
FIG. 4 is a schematic cross-sectional view of the part of the circuit substrate, which is taken along a line IV-IV in FIG. 3.
Figure 5:
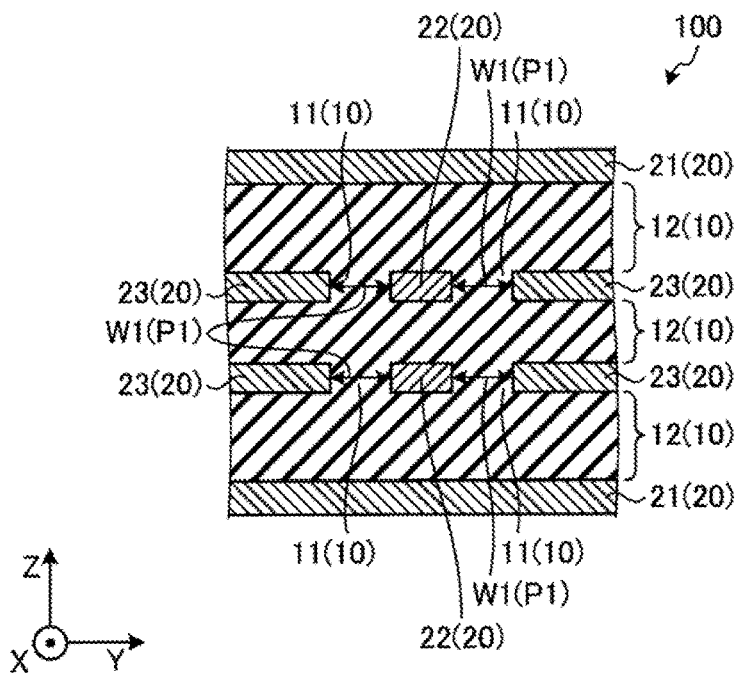
FIG. 5 is a schematic cross-sectional view of the part of the circuit substrate, which is taken along a line V-V in FIG. 3.

FIG. 3 is a cross-sectional view of a part of the circuit substrate 100 of a first embodiment in a direction crossing a thickness direction of the circuit substrate 100. FIG. 4 is a cross-sectional view of the part of the circuit substrate 100 along the thickness direction, which is taken along a line IV-IV in FIG. 3. FIG. 5 is another cross-sectional view of the part of the circuit substrate 100 along the thickness direction of the circuit substrate 100, which is taken along a line V-V in FIG. 3. Arrows X, Y, and Z that indicate directions are described in each of FIGS. 3 to 11. X direction, Y direction, and Z direction are perpendicular to each other. X direction and Y direction are plane directions along a surface or a back surface of the circuit substrate 100. Z direction is the thickness direction, that is, a laminated direction, of the circuit substrate 100.

As shown in FIGS. 3 to 5, the circuit substrate 100 includes multiple insulating layers 10, which correspond to an insulating body, and multiple conductive layers 20.

As shown in FIGS. 4 and 5, the insulating layers 10 and the conductive layers 20 are alternately laminated in the thickness direction in the circuit substrate 100. The circuit substrate 100 may be produced by a known production method. The thickness direction is an example of a second direction.

The conductive layers 20 described at the uppermost side and the lowest side in FIGS. 4 and 5 may be shield layers 21 that extend in X direction and Y direction.

The circuit substrate 100 has two conductive layers 20 that are provided in the intermediate part in the thickness direction. Each of the two conductive layers 20 includes a wiring part 22 and a reference conductor 23. The two conductive layers 20 have the same structure at least in the area shown in the figures.

The wiring part 22 and the reference conductor 23 of each of the two conductive layers 20 are aligned in Y direction. The wiring part 22 and the reference conductor 23 are insulated from each other by a separating part 11 of the insulating layer 10. The reference conductor 23 is positioned at each side of the wiring part 22 in Y direction via the separating part 11 in each of the two conductive layers 20. Each of the separating part 11 is an example of the first separating part, and each of the reference conductor 23 is an example of the first conductor part. Y direction is an example of a first direction.

The circuit substrate 100 also has interlayers 12 as the insulating layers 10, and the interlayers 12 are adjacent to the wiring parts 22, the reference conductors 23, and the separating parts 11 in the thickness direction. The wiring parts 22, the reference conductors 23, and the separating parts 11 are covered with the interlayers 12 in the thickness direction and are disposed between two interlayers 12 in the thickness direction. In other words, each of the interlayer 12 is disposed between the shield layer 21 and the wiring part 22, between the shield layer 21 and the reference conductor 23, between the two wiring parts 22, between the two reference conductors 23, and between the two separating parts 11. The separating parts 11 and the interlayers 12 are parts of the insulating layers 10 and may be formed in the same step in a production process. Each of the interlayers 12 is an example of the insulating part. The interlayer 12 may also be referred to as an intermediate layer.

The two wiring parts 22, which are aligned in the thickness direction, respectively extend in parallel to each other along approximately X direction in the circuit substrate 100. The two wiring parts 22 form a pair and have the same structure at least in the area shown in the figures.

The wiring parts 22 are electrically connected to multiple electric components that are mounted on the circuit substrate 100, such as the controller 2a, the memory 2b, the data buffer 2c, and the interface 2d, and thus, the wiring parts 22 and the multiple electric components transmit signals therebetween.

The pair of the wiring parts 22 may be used as differential wirings that can transmit serial differential signals. The wiring part 22 may also be called a signal wiring. One of the two wiring parts 22 is an example of the first wiring part, and the other is an example of a second wiring part. The wiring parts 22 are not limited to the differential wirings.

Moreover, the circuit substrate 100 has vias 30 that extend in the thickness direction. The vias 30 are conductors and electrically connect the multiple conductive layers 20. The vias 30 are, for example, through vias, but may be stacked vias, buried vias, blind vias, or the like. Each of the vias 30 is an example of the first connecting part.

As shown in FIG. 3, the wiring parts 22 are formed in a straight and strip shape. The longitudinal direction of X direction of the wiring parts 22 is an example of a third direction.

The separating part 11 is formed adjacent to each side in the width direction, that is, in the vertical direction in FIG. 3, of the wiring part 22. The separating parts 11 extend in X direction along the wiring part 22. Y direction of the separating parts 11 and the wiring part 22 is an example of the first direction. Additionally, the longitudinal direction of the wiring part 22 may also be called a longitudinal direction of the separating parts 11.

The multiple vias 30 are arranged at a predetermined space along the longitudinal direction of the wiring part 22. Thus, the longitudinal direction of the wiring part 22 is a direction of arranging the vias 30. The vias 30 are arranged at each side of the wiring part 22 in Y direction. In the present embodiment, for example, the via 30 that is included in one of the rows in the width direction of the vias 30 and the via 30 that is included in the other row in the width direction of the vias 30 are aligned in the width direction. The distance between the vias 30 may not be constant.

As clearly shown in FIGS. 3 and 4, the vias 30 penetrate through the circuit substrate 100 in the thickness direction and electrically connect the multiple conductive layers 20, which are arranged at different positions in the thickness direction, such as the shield layers 21 and the reference conductors 23. The vias 30 penetrate the reference conductors 23 in the thickness direction at a position in contact with or close to edges 23a in the width direction of the reference conductors 23. The edges 23a are boundaries between the reference conductors 23 and the separating parts 11. The vias 30 electrically connect between the shield layer 21 and the reference conductor 23, between the multiple shield layers 21, and between the multiple reference conductors 23. The potential of each of the shield layers 21 and the reference conductors 23 may be set at a ground potential, a power source potential, or the like. In the present embodiment, for example, all of the conductive layers 20 except for the wiring parts 22 are electrically connected by the multiple vias 30 and are thus set at approximately the same potential. However, it is not necessary to electrically connect all of the conduct layers 20 by the vias 30 as described above, and some of the conduct layers 20 may be applied with a potential that is different from the potential of the other conduct layers 20.

The wiring part 22 has a characteristic impedance that varies depending on the position of the wiring part 22. Great variation in the characteristic impedance tends to degrade signal transmission characteristics of the wiring part 22. The characteristic impedance differs by a parasitic capacitance at each position of the wiring part 22. The parasitic capacitance at each position increases as the distance between the wiring part 22 and the surrounding conductor, such as the reference conductor 23 or the via 30, decreases.

In view of this, in the present embodiment, as shown in FIG. 3, a width W1 of the separating part 11 at a position P1 is set smaller than a width W2 of the separating part 11 at a position P2. The position P1 is apart from the via 30. The position P2 is closer to the via 30 than the position P1 is. The widths W1 and W2 are widths of the separating part 11 along Y direction. In other words, the widths W1 and W2 of the separating part 11 are distances along Y direction between the wiring part 22 and the reference conductor 23. Specific values for the widths W1 and W2 are appropriately set in accordance with the specifications of the vias 30 and other parameters. The widths W1 and W2 may be appropriately set by simulation, experiment, or the like.

For example, as a result of intensive studies performed by the inventors, it is found that the widths W1 and W2 are more effectively set when the width W2 is equal to or greater than double of the width W1. This relationship is obtained from the results of the studies based on the following exemplary case. That is, the respective wiring parts 22 and the reference conductors 23, which are aligned in Y direction, have the same thickness t1, as shown in FIG. 4. Moreover, the interlayers 12, which are aligned in Y direction, have the same thickness t2, as shown in FIG. 4, and the thickness t2 is equal to or greater than triple of the thickness t1.

According to such a structure, the difference in the parasitic capacitance among different positions of the wiring part 22 is reduced. Thus, according to the present embodiment, for example, the variation and discontinuity in the characteristic impedance of the wiring part 22 due to the positional difference are more reduced. As a result, the signal transmission characteristics can be further improved. The wirings for obtaining the effects of this structure are not limited to differential wirings. Nevertheless, this structure is more effectively used when the pair of the two wiring parts 22 is formed of differential wirings because the differential wirings are highly sensitive to the surrounding parasitic capacitance.

The relationship between the distance to the via 30 and the width of the separating part 11 is such that the width of the separating part 11 increases as closer to the via 30 in X direction. Such a relationship is satisfied at the other two positions as well as at the position P1 shown in FIGS. 3 and 5 and the position P2 shown in FIGS. 3 and 4. The position P1 is an example of the first position, the width W1 is an example of the first width, the position P2 is an example of the second position, and the width W2 is an example of the second width.

That is, the separating part 11 has a section in which its width measured in the Y direction gradually decreases as points of the section become farther from the via 30 in the X direction and also has a section in which its width measured in the Y direction gradually increases as points of the section approaches the via 30 in the X direction. In other words, the distance in Y direction between the wiring part 22 and the reference conductor 23 gradually decreases as separating in X direction from the via 30 and gradually increases as approaching in X direction to the via 30. This structure is formed at least at a position adjacent to the via 30, that is, at a position that is apart in X direction from the via 30 within a predetermined range. The separating part 11 is interposed in Y direction between the wiring part 22 and the reference conductor 23.

In this embodiment, as shown in FIG. 3, the wiring part 22 has an approximately constant width and straightly extends in a strip shape, and the edge 23a in the wiring part 22 side of the reference conductor 23 bends between two vias 30. Specifically, the reference conductor 23 has a protrusion 23b that protrudes in Y direction to the wiring part 22 between the two vias 30. Such a structure enables to form the wiring part 22 straightly, thereby reducing the length in the longitudinal direction of the wiring part 22 more than in a case of bending the wiring part 22. Thus, for example, the electric resistance of the wiring part 22 is further reduced.

The characteristic impedance of the wiring part 22 also depends on the electric resistance at each position of the wiring part 22. The electric resistance at each position depends on a cross section of the wiring part 22. Regarding this point, in the present embodiment, the width and the thickness or the height at each position of the wiring part 22 are constant, and thus, the cross section of the wiring part 22 is approximately constant. Thus, according to the present embodiment, such a structure also allows for further reduction in the variation in the characteristic impedance of the wiring part 22 due to the positional difference, whereby the signal transmission characteristics can be further improved.

In the present embodiment, as shown in FIG. 3, the separating part 11 has a section in which its width linearly varies along X direction. Specifically, the edge 23a of the reference conductor 23 straightly extends in a direction obliquely crossing X direction in a section in which the distance to the wiring part 22 varies. Moreover, the edge 23a straightly extends along the longitudinal direction in a section in which the distance to the wiring part 22 is constant. The edge 23a bends between the section in which the distance to the wiring part 22 varies and the section in which the distance to the wiring part 22 is constant. According to this structure, for example, compared with a case of forming a wiring part 22 and a separating part 11 in curve shapes, the wiring part 22 of a wiring pattern and the separating part 11, and thus the circuit substrate 100, can be formed more easily at lower cost.

Second Embodiment

Figure 6:
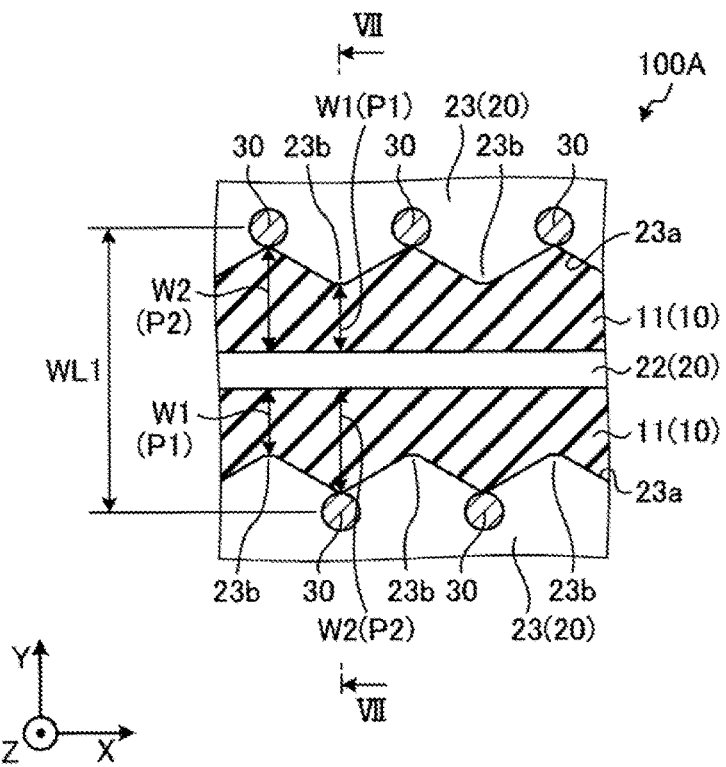
FIG. 6 is a schematic cross-sectional view of a part of a circuit substrate according to a second embodiment, which is taken along a line VI-VI in FIG. 7.
Figure 7:
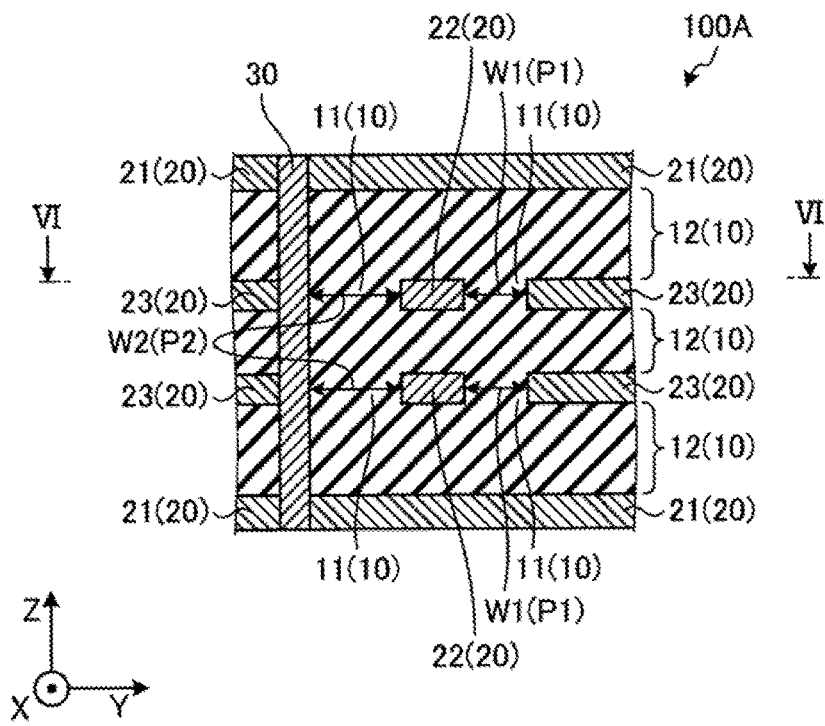
FIG. 7 is a schematic cross-sectional view of the part of the circuit substrate of the second embodiment, which is taken along a line VII-VII in FIG. 6.

FIG. 6 is a cross-sectional view of a part of a circuit substrate 100A of a second embodiment in a direction crossing a thickness direction. FIG. 7 is a cross-sectional view of the part of the circuit substrate 100A along the thickness direction, which is taken along a line VII-VII in FIG. 6. As shown in FIG. 6, in the second embodiment, the vias 30 at each side of the wiring part 22 are not aligned but are alternately arranged in Y direction. Yet, as clearly shown in FIGS. 6 and 7, in the second embodiment, the width W1 of the separating part 11 at the position P1 is set smaller than the width W2 of the separating part 11 at the position P2, as in the case of the first embodiment. The position P1 is apart from the via 30. The position P2 is closer to the via 30 than the position P1 is. Accordingly, for example, the present embodiment allows for further reduction in the variation and the discontinuity in the characteristic impedance of the wiring part 22 due to the positional difference, thereby further improving the signal transmission characteristics, as in the case of the first embodiment.

Third Embodiment

Figure 8:
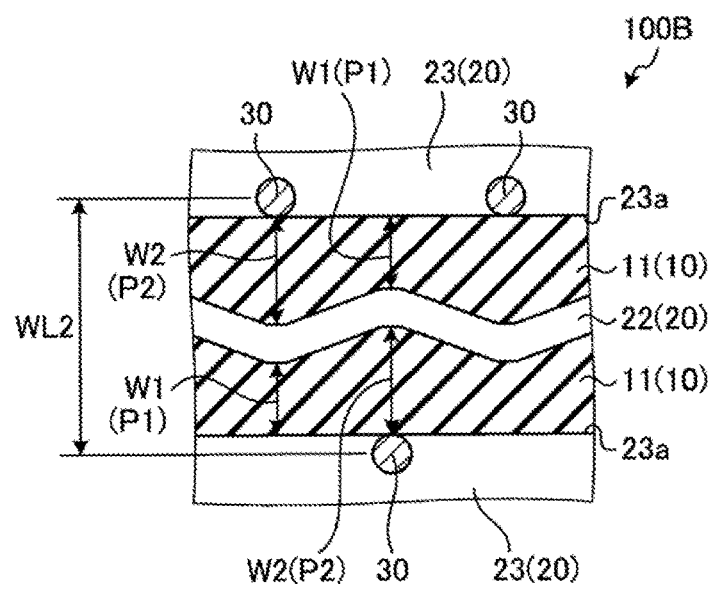
FIG. 8 is a schematic cross-sectional view of a part of a circuit substrate according to a third embodiment, in a direction crossing a thickness direction.

FIG. 8 is a cross-sectional view of a part of a circuit substrate 100B of a third embodiment in a direction crossing a thickness direction. As shown in FIG. 8, in the third embodiment, the vias 30 at each side of the wiring part 22 are not aligned but are alternately arranged in Y direction, as in the case of the second embodiment. However, whereas the wiring part 22 straightly extends in a strip shape in the second embodiment, the wiring part 22 has an approximately constant width and extends in a wavelike shape or a saw-tooth shape in the third embodiment. That is, the wiring part 22 extends while bending in a zigzag shape so as to alternately detour around the via 30 in one side and the via 30 in the other side in the width direction. The wiring part 22 has multiple sets that include a first section, a first oblique section, a second section, and a second oblique section, and the multiple sets are aligned in Y direction. The first section extends in X direction. The second section is positioned apart in X direction and Y direction from the first section and extends in X direction. The first oblique section extends in a first oblique direction that crosses X direction and Y direction between the first section and the second section. The second oblique section extends in a second oblique direction that crosses X direction, Y direction, and the first oblique direction between the first section and the second section.

Yet, as clearly shown in FIG. 8, in the present embodiment, the width W1 of the separating part 11 at the position P1 is set smaller than the width W2 of the separating part 11 at the position P2, as in the cases of the first embodiment and the second embodiment. The position P1 is apart from the via 30. The position P2 is closer to the via 30 than the position P1 is. Accordingly, for example, the present embodiment allows for further reduction in the variation and the discontinuity in the characteristic impedance of the wiring part 22 due to the positional difference, thereby further improving the signal transmission characteristics, as in the cases of the first embodiment and the second embodiment.

Moreover, as it is clear from the comparison of FIG. 8 with FIGS. 3 and 6, a width WL2 between the rows of the vias 30 at both sides of the wiring part 22 in the present embodiment can be made smaller than a width WL1 between the rows of the vias 30 at both sides of the wiring part 22 in the first embodiment or the second embodiment. Thus, for example, the present embodiment enables reduction in the width or the area that is necessary for arranging the wiring part 22 of a signal wiring of a lane in the circuit substrate 100B, whereby the circuit substrate 100B can be formed smaller in size. The width WL2 between the rows of the vias 30 may also be called a lane width.

In the present embodiment, the separating part 11, the reference conductor 23, and the vias 30, which are described over the wiring part 22 in FIG. 8, may be examples of the first separating part, the first conductor part, and the first connecting part, respectively. Similarly, the separating part 11, the reference conductor 23, and the via 30, which are described under the wiring part 22 in FIG. 8, may be examples of a second separating part, a second conductor part, and a second connecting part, respectively.

First Variation

Figure 9:
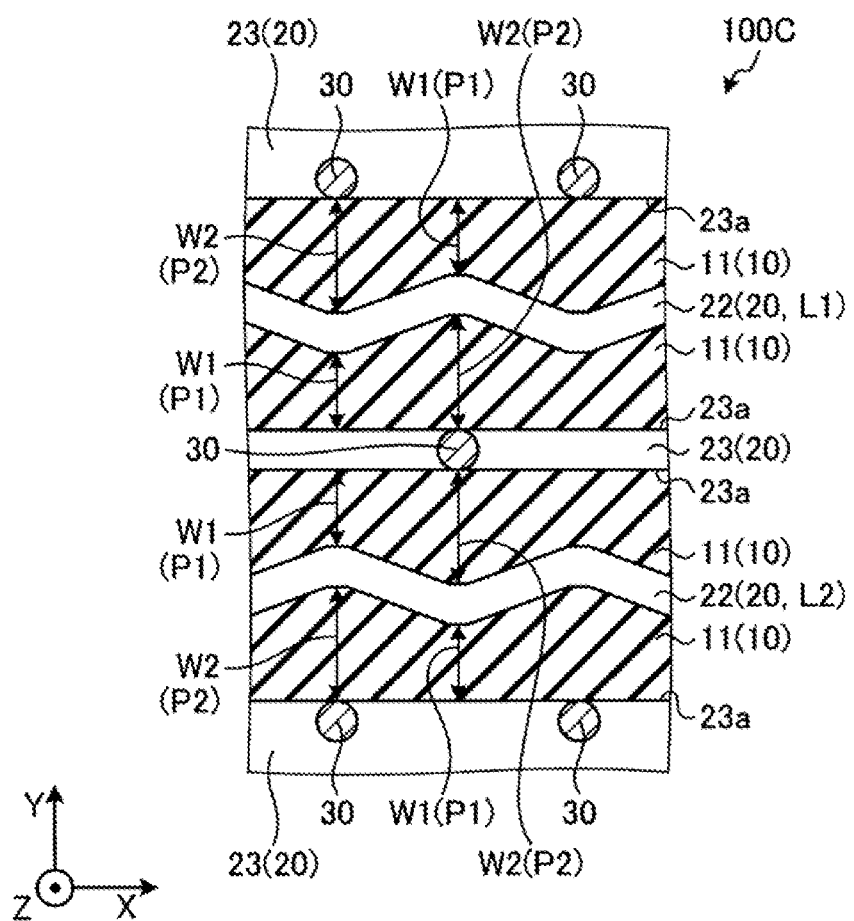
FIG. 9 is a schematic cross-sectional view of a part of a circuit substrate according to a first variation, in a direction crossing a thickness direction.

FIG. 9 is a cross-sectional view of a part of a circuit substrate 100C of a first variation in a direction crossing a thickness direction. As it is clear from the comparison of FIG. 9 with FIG. 8, the circuit substrate 100C of this variation has the wiring parts 22 of the signal wirings, and the wiring parts 22 are provided in parallel in Y direction at a predetermined distance. The wiring parts 22 have a structure similar to that of the wiring part 22 in the third embodiment. The effects that are obtained by the third embodiment are more effectively obtained in the case of providing the wiring parts 22 in parallel in the width direction at a predetermined distance, as in this variation. That is, for example, this variation enables further reduction in the width or the area that is necessary for providing the wiring parts 22 of a first lane L1 and a second lane L2 in parallel in the plane direction in Y direction to the circuit substrate 100C. As a result, the circuit substrate 100C can be formed smaller in size.

Second Variation

Figure 10:
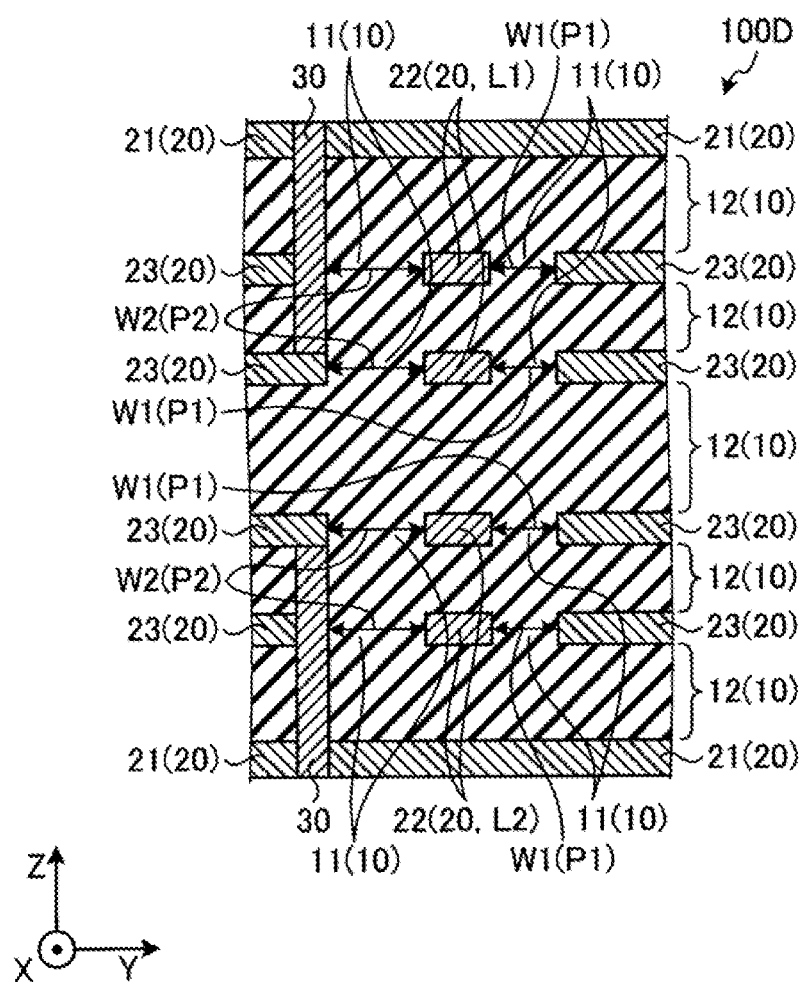
FIG. 10 is a schematic cross-sectional view of a part of a circuit substrate according to a second variation along a thickness direction.

FIG. 10 is a cross-sectional view of a part of a circuit substrate 100D of a second variation along a thickness direction. The circuit substrate 100D of this variation has the wiring parts 22 of the signal wirings, and the wiring parts 22 are provided in parallel in the thickness direction of the laminated direction of the circuit substrate 100D at a predetermined distance. The wiring parts 22 have a structure similar to that of the wiring part 22 in the second embodiment or the third embodiment. This variation also brings effects that are similar to those in the second embodiment and the third embodiment. The example shown in FIG. 10 has only an interlayer 12 of the insulating layer 10 between the two pairs of the wiring parts 22. One pair of the wiring parts 22 are described in the upper side in FIG. 10 and form a first lane L1. The other pair of the wiring parts 22 are described in the lower side in FIG. 10 and form a second lane L2. However, the conductive layer 20, such as the shield layer 21, may be disposed between the first lane L1 and the second lane L2.

Third Variation

Figure 11:
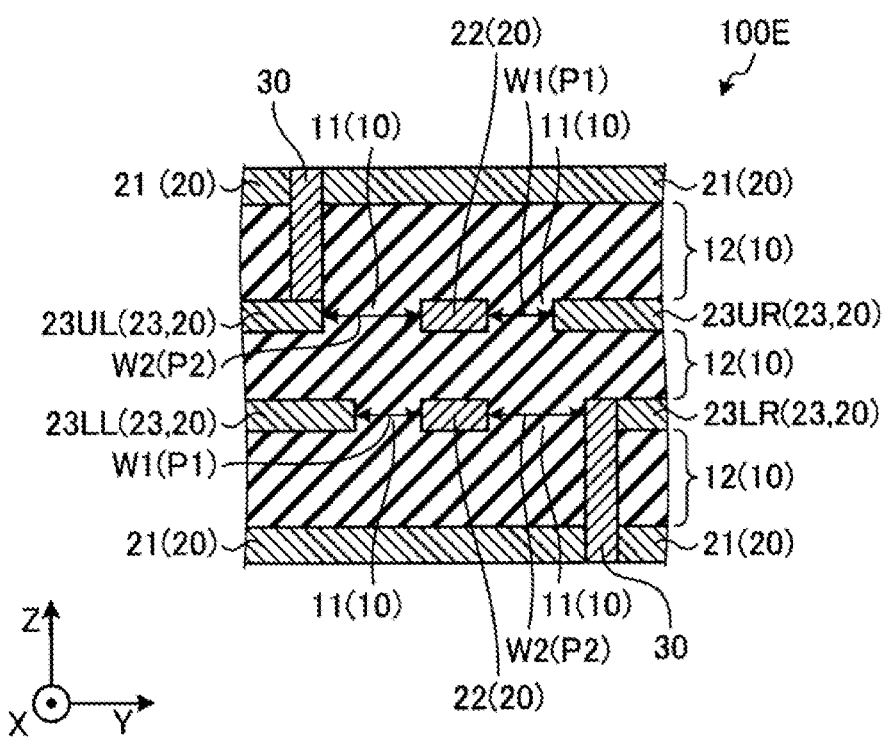
FIG. 11 is a schematic cross-sectional view of a part of a circuit substrate according to a third variation along a thickness direction.

FIG. 11 is a cross-sectional view of a part of a circuit substrate 100E of a third variation along a thickness direction. As shown in FIG. 11, a reference conductor 23UL in the left side in FIG. 11 is connected to the via 30, whereas a reference conductor 23UR in the right side in FIG. 11 is not connected to the via 30, at the position of the cross section shown in FIG. 11 in the circuit substrate 100E of this variation. The two reference conductors 23UL and 23UR and the wiring part 22 in the upper side in FIG. 11 are aligned in Y direction. On the other hand, a reference conductor 23LL in the left side in FIG. 11 is not connected to the via 30, whereas a reference conductor 23LR in the right side in FIG. 11 is connected to the via 30. The two reference conductors 23LL and 23LR and the wiring part 22 in the lower side in FIG. 11 are aligned in Y direction. In this variation, as in the same manner as in the embodiments and the variations described above, the width W1 of the separating part 11 at the position P1 is set smaller than the width W2 of the separating part 11 at the position P2. The position P2 is closer to the via 30 in X direction than the position P1 is. Thus, in this variation, the wiring part 22 in the conductive layer 20 in the upper side in FIG. 11 and the wiring part 22 in the conductive layer 20 in the lower side in FIG. 11 are aligned in Z direction. However, the positions of the edges at the wiring part 22 sides of the reference conductors 23 are shifted from each other in Y direction. Such a structure allows, for example, further reduction in the variation and the discontinuity in the characteristic impedance of the wiring part 22 due to the positional difference, whereby the signal transmission characteristics can be further improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A circuit substrate comprising: an insulating body;
   a wiring enclosed by the insulating body and extending in a first direction: a first conductive layer formed within the insulating body in a same plane as the wiring, and electrically insulated from the wiring by the insulating body; and
   one or more conductive vias extending through an edge portion of the first conductive layer in a thickness direction intersecting the plane, wherein
   a first width of the insulating body in a second direction that crosses the first direction between the wiring and the first conductive layer at a first position in the plane that does not correspond to any of said one or more conductive vias is smaller than a second width of the insulating body in the second direction between the wiring and the first conductive layer at a second position in the plane direction that corresponds to one of said one or more conductive vias, and a width of the insulating body in the second direction continuously increases between the first and second positions; wherein each of the conductive vias is in contact with the insulating body in the plane.

2. The circuit substrate according to claim 1, wherein
   a plurality of said conductive vias, each of which extends in the thickness direction, is arranged in the plane, and
   a boundary between the first conductive layer and the insulating body is uneven.

3. The circuit substrate according to claim 2, further comprising:
   a second conductive layer that is formed within the insulating body on the same plane as the wiring, and is electrically insulated from the wiring by the insulating body, the first and second conductive layers being formed at opposite sides of the wiring; and
   a plurality of second conductive vias extending through an edge portion of the second conductive layer in the thickness direction.

4. The circuit substrate according to claim 3, wherein
   the boundary between the first conductive layer and the insulating body and a boundary between the second conductive layer and the insulating body is symmetrical with respect to the wiring.

5. The circuit substrate according to claim 3, wherein
   the boundary between the first conductive layer and the insulating body and a boundary between the second conductive layer and the insulating body is asymmetrical with respect to the wiring.

6. The circuit substrate according to claim 1, wherein
   the first width is a local minimum width of the insulating body in the second direction between the wiring and the first conductive layer, and
   the second width is equal to or greater than twice the first width.

7. The circuit substrate according to claim 1, further comprising:
   a second wiring enclosed by the insulating body and formed in a plane that is different from the plane in which the wiring is formed, the wiring and the second wiring forming a differential wiring.

8. The circuit substrate according to claim 7, wherein
   said one or more conductive vias penetrate through the insulating body through the plane of the wiring and the plane of the second wiring.

9. A storage device comprising: a circuit substrate;
   a nonvolatile semiconductor memory module on the circuit substrate; a memory controller on the circuit substrate; and an interface formed on an edge of the circuit substrate, wherein the circuit substrate includes: an insulating body;
   a wiring enclosed by the insulating body and extending in a first direction: a conductive layer formed within the insulating body in a same plane as the wiring, and electrically insulated from the wiring by the insulating body; and
   one or more conductive vias extending through an edge portion of the conductive layer in a thickness direction intersecting the plane, wherein
   a first width of the insulating body in a second direction that crosses the first direction between the wiring and the conductive layer at a first position in the plane that does not correspond to any of said one or more conductive vias is smaller than a second width of the insulating body in the second direction between the wiring and the conductive layer at a second position in the plane direction that corresponds to one of said one or more conductive vias, and a width of the insulating body in the second direction continuously increases between the first and second positions; wherein each of the conductive vias is in contact with the insulating body in the plane.

10. The storage device according to claim 9, wherein the wiring is straight.

11. The storage device according to claim 9, wherein the wiring has a zigzag shape.

12. The circuit substrate according to claim 9, wherein
    the circuit substrate further includes a second wiring enclosed by the insulating body and formed in a plane that is different from the plane in which the wiring is formed, the wiring and the second wiring forming a differential wiring.

13. The circuit substrate according to claim 9, wherein said one or more conductive vias penetrate through the insulating body in the thickness direction.

\* \* \* \* \*